(12) United States Patent
Su

(10) Patent No.: US 8,883,316 B2
(45) Date of Patent: Nov. 11, 2014

(54) COMPOSITE MATERIAL AND HIGH FREQUENCY SUBSTRATE MADE THEREFROM

(75) Inventor: Min She Su, Dongguan (CN)

(73) Assignee: Guangdong Shengyi Sci. Tech Co., Ltd., Dongguan (CN)

( * ) Notice: Subject to any disclaimer, the term of this patent is extended or adjusted under 35 U.S.C. 154(b) by 829 days.

(21) Appl. No.: 12/694,948

(22) Filed: Jan. 27, 2010

(65) Prior Publication Data

US 2011/0045304 A1    Feb. 24, 2011

(30) Foreign Application Priority Data

Aug. 24, 2009    (CN) .......................... 2009 1 0189729

(51) Int. Cl.
| | | |
|---|---|---|
| B32B 15/00 | (2006.01) | |
| H05K 1/03 | (2006.01) | |
| C08F 212/14 | (2006.01) | |
| C08F 212/34 | (2006.01) | |
| C08J 5/24 | (2006.01) | |
| C08L 25/18 | (2006.01) | |
| C08F 212/08 | (2006.01) | |
| C08L 9/06 | (2006.01) | |
| C08K 3/40 | (2006.01) | |
| C08K 7/14 | (2006.01) | |
| C08K 3/00 | (2006.01) | |
| C08K 5/00 | (2006.01) | |
| C08K 5/14 | (2006.01) | |

(52) U.S. Cl.
CPC . *C08J 5/24* (2013.01); *H05K 1/032* (2013.01); C08K 3/40 (2013.01); H05K 1/0366 (2013.01); *C08F 212/14* (2013.01); *C08F 212/34* (2013.01); H05K 2201/0158 (2013.01); H05K 1/0373 (2013.01); C08J 2309/06 (2013.01); H05K 2201/0209 (2013.01); C08J 2325/18 (2013.01); C08K 7/14 (2013.01); *C08L 25/18* (2013.01); H05K 2201/012 (2013.01); C08K 3/0033 (2013.01); C08J 2353/02 (2013.01); C08K 5/0066 (2013.01); C08K 5/14 (2013.01); C08J 2309/00 (2013.01); *C08F 212/08* (2013.01); *C08L 9/06* (2013.01)
USPC ........ 428/432; 428/419; 428/441; 428/422.8; 428/422; 428/428; 442/180

(58) Field of Classification Search
USPC .............. 428/419, 441, 422.8, 432, 422, 428; 156/307.5
See application file for complete search history.

(56) References Cited

U.S. PATENT DOCUMENTS

| | | | | |
|---|---|---|---|---|
| 4,784,917 | A | * | 11/1988 | Tawara et al. ................. 428/441 |
| 5,302,662 | A | * | 4/1994 | Landry et al. .................. 525/66 |
| 5,571,609 | A | * | 11/1996 | St. Lawrence et al. ....... 442/234 |

\* cited by examiner

*Primary Examiner* — Angela Ortiz
*Assistant Examiner* — Klee Simmons
(74) *Attorney, Agent, or Firm* — McDonald Hopkins LLC

(57) ABSTRACT

The present invention relates to a composite material, a high-frequency circuit substrate made therefrom and making method thereof. The composite material comprises 20-70 parts by weight of thermosetting mixture, a fiberglass cloth, a powder filler, a flame retardant, and a cure initiator. The thermosetting mixture includes a resin containing vinyl in the amount of more than 60% composed of carbon and hydrogen with its molecular weight being less than 11000, and a solid styryl resin of middle or low molecular weight with unsaturated double bonds. The made high-frequency circuit substrate comprises a plurality of prepregs mutually overlapped, and copper foils respectively covered on both sides of overlapped prepregs. Each prepreg is made from the composite material. The composite material of the present invention enable to readily make prepregs. The high-frequency circuit substrate made from the composite material has low dielectric constant, low dielectric loss tangent, and good heat resistance, and is convenient for process operation. Therefore, the composite material of the present invention is suitable for making circuit substrates of high-frequency electronic equipments.

7 Claims, No Drawings

COMPOSITE MATERIAL AND HIGH FREQUENCY SUBSTRATE MADE THEREFROM

FIELD OF THE INVENTION

The invention relates to a composite material, a high-frequency circuit substrate made therefrom and making method thereof, particularly to a thermosetting dielectric composite material, a high-frequency circuit substrate made therefrom and making method thereof.

BACKGROUND OF THE INVENTION

In recent years, with computers and information communication equipments developing toward high performance, high function and networking, to transmit and process large-capacity information at high speed, operation signals tend to be high-frequency. Therefore, the material of the circuit substrate material is required to be improved.

In a high-frequency circuit, the transmission loss of electrical signals is expressed by the sum of dielectric loss, conductor loss and radiation loss. The frequency of the electrical signals is higher, the dielectric loss, conductor loss and radiation loss are more. The transmission loss weakens the electrical signals and destroys the reliability of the electrical signals. So, the decreasing of the dielectric loss, conductor loss and radiation loss on a circuit board processing high-frequency signals needs to be inhibited. Dielectric loss is proportional to the product of the square root of the dielectric constant of the insulator forming the circuit, the dielectric loss tangent, and the frequency of the signals used. So, as an insulator, the decreasing of the dielectric loss can be inhibited by choosing an insulating material with low dielectric constant and the dielectric loss tangent.

Among the conventional materials used for a printed circuit substrate, the epoxy resin with excellent adhesion characteristics is widely used. However, the epoxy resin circuit substrate has relatively high dielectric constant and dielectric loss tangent (dielectric constant is more than 4, and dielectric loss tangent is around 0.02), and inadequate high-frequency characteristics, which results in failure in meeting the requirement of high-frequency signals. Polytetrafluoroethylene, as a representative of fluor resins, is always being used as the substrate material for processing high-frequency signals, since it has low dielectric constant and dielectric loss tangent. However, polytetrafluoroethylene is a highly inert thermoplastic material, which is hard to be molded and processed. So, researchers in the field do various researches on insulating materials with low dielectric constant and dielectric loss tangent, which are easy to form varnishes by utilizing organic solvents, are easy to molded and processed, have low curing temperature, are easy to operate, and are not of fluorine. Eliminating or decreasing polarity groups in the molecular structure is good for obtaining materials with low dielectric constant and dielectric loss tangent, and proposals have been provided, such as cured polyolefin, resins of cyanate ester, cured polyphenylene ether, allyl modified polyphenylene ether, vinyl modified polyphenylene ether, polyvinyl benzyl ether resin, divinylbenzene or divinyl naphthyl modified polyether imide, and liquid crystal resins. These resin compositions with low dielectric constant and dielectric loss tangent are designed as thermosetting resins, since they must endure electronic unit manufacturing procedures such as solder reflux and metal wire welding.

In these existing proposals, cured polyolefin resin materials are attracting more attention since they have low dielectric constant and dielectric loss tangent that are comparatively low and close to polytetrafluoroethylene. For a long time, technicians in the field have studied thermosetting polybutadiene or copolymer resin of polybutadiene and styrene with excellent dielectric properties. The results of these studies are cited as follows.

PCT patent application No. WO97/38564 disclosed to use nonpolar styrene-polybutadiene divinyl benzene terpolymer added with magnesium aluminum silicate as filler, and use fiberglass cloth as reinforcing material to make circuit substrate which has excellent dielectric properties but poor heat resistance; the glass transition temperature of the substrate is only about 100° C., and the coefficient of thermal expansion is very big. So it is hard to meet the high temperature (over 240° C.). requirement in the lead free process of manufacturing PCBs.

U.S. Pat. No. 5,571,609 disclosed to use 1,2-polybutadiene resin or polyisoprene with molecular weight being less than 5000, to cooperate with polybutadiene styrene copolymer with high molecular weight, added with many silica as filler, and use fiberglass cloth as reinforcing material to make circuit substrate which has excellent dielectric properties, but in the patent, high molecular weight (Mn is over 50000) component is adopted to improve tacky property of the prepregs, so the processing property during manufacturing prepregs becomes poor. The proportion of rigid structure benzene ring in the resin molecule of the whole resin system is very small, and the cross-linked segments are mostly composed of methylenes with very low rigidity. Thus, the made sheet has poor rigidity and very low bending strength. Besides, the patent adopted much silica as a filler to improve tacky property of the prepregs, and the hardness of silica is very big, so, the drill bit will be worn more during the PCB processing.

U.S. Pat. No. 6,569,943 disclosed to use amine modifier polybutadiene liquid resin with vinyl at the molecule terminal, which is added with monomers of middle or low molecular weight as curing agent and diluent, and use impregnate fiberglass cloth to make circuit substrate. Although the dielectric property is good, for the resin system is liquid at normal temperature, it can not be made into tack-free prepreg. Therefore, in the compression moulding of sheet, it is difficult to adopt common stacked technology of prepreg, which results in difficult process operation.

In the Chinese paten application No. 200910106628.9, allyl novolac of middle or low molecular weight was used as the curing agent to effectively improve the tacky property, heat resistance and mechanical strength of prepregs, and to obtain a comparatively good dielectric property.

The present invention is a further improvement based on the Chinese paten application No. 200910106628.9, by introducing a solid styryl resin of middle or low molecular weight with unsaturated double bonds. Not only the advantages in the Chinese paten application No. 200910106628.9 are obtained, but also the dielectric property is further improved.

SUMMARY OF THE INVENTION

An object of the present invention is to provide a composite material that comprises a resin composed of carbon and hydrogen containing high vinyl, and a solid styryl resin of middle or low molecular weight with unsaturated double bonds as curing agent, which can provide a high-frequency circuit substrate with adequate high-frequency dielectric properties, high temperature resistance, high peel strength of circuit substrate, and good processing property.

Another object of the present invention is to provide a high-frequency circuit substrate made from the above mentioned composite material, which has high-frequency dielectric properties, high temperature resistance, and high peel strength of circuit substrate.

A further object of the present invention is to provide a making method of the above mentioned high-frequency circuit substrate, by improving the resin system of the composite material and impregnating fiberglass cloth to make tack-free prepregs, which can adopt common automatic stacked technology in the compression moulding of the sheets, whereby the process operation is more convenient.

To achieve the above mentioned objects of the present invention, the present invention provides a composite material, which comprises a thermosetting mixture in an amount of 20-70 parts by weight, a fiberglass cloth in an amount of 10-60 parts by weight, a powder filler in an amount of 0-55 parts by weight, and a cure initiator in an amount of 1-3 parts by weight. The thermosetting mixture includes a liquid resin containing vinyl in an amount of more than 60% composed of carbon and hydrogen with its molecular weight being less than 11000; and a solid styryl resin of middle or low molecular weight with unsaturated double bonds, of which the molecular weight is 5000-50000.

The present invention also provides a high-frequency circuit substrate made from the composite material, comprising: a plurality of prepregs mutually overlapped and copper foils respectively disposed at both sides of the overlapped prepregs; wherein, each prepreg is made from the composite material.

The present invention also provides a making method of using the above mentioned composite material to make a high-frequency circuit substrate, including the following steps:

Step 1, weighing the components of the composite material, which comprises: (1) 20-70 parts by weight of thermosetting mixture including a resin containing vinyl in the amount of more than 60% composed of carbon and hydrogen with its molecular weight being less than 11000, and a solid styryl resin of middle or low molecular weight, with the number average molecular weight being between 5000 and 50000, and with unsaturated double bonds, (2) 10-60 parts by weight of fiberglass cloth, (3) 0-55 parts by weight of powder filler, (4) 1-3 parts by weight of cure initiator;

Step 2, mixing the weighed thermosetting mixture, powder filler, flame retardant and cure initiator, diluting the resin system to an appropriate viscosity with a solvent, evenly stirring and mixing to make the filler evenly disperse in the resin system thereby obtaining a glue solution, impregnating the fiberglass cloth in the glue solution and controlling the fiberglass cloth to be at an appropriate thickness, and then removing the solvent to form prepregs;

Step 3, overlapping a plurality of said prepregs, respectively covering a copper foil on both top and bottom surfaces of the overlapped prepregs, putting the prepregs and copper foil assembly into a press machine to cure with a curing temperature of 150-300° C. and a curing pressure of 25-70 Kg/cm$^2$, and thereby forming the high-frequency circuit substrate.

The beneficial effects of the present invention are described as follows. Firstly, a resin composed of carbon and hydrogen containing high vinyl with excellent dielectric properties is adopted, so as to provide the necessary high-frequency dielectric properties and high temperature resistance to a circuit substrate by the cross-linking reaction of a great quantity of unsaturated double bonds in the resin.

Secondly, the solid styryl resin with unsaturated double bonds is adopted as a curing agent to improve the heat resistance and rigidity of the circuit substrate, and to reduce the mold temperature.

Thirdly, the tacky problem of the prepregs caused by only using liquid resin is improved by co-using the solid styryl resin of middle or low molecular weight with unsaturated double bond and the resin composed of carbon and hydrogen containing high vinyl.

In summary, the composite material of the present invention enable to manufacture prepregs easily, and have high binding power of the copper foil. The high-frequency circuit substrate manufactured from the composite material has low dielectric constant, low dielectric loss tangent, and good heat resistance, and is convenient to process operation. So the composite material of the present invention is suitable for manufacturing circuit substrates of high-frequency electronic equipments.

DESCRIPTION OF THE PREFERRED EMBODIMENTS

To further set forth the technical solution adopted by the present invention to achieve the predetermined objects and the effects, please read the following detailed description according to the present invention, and, the objects, characteristics and novel features of the present invention will be best understood.

The present invention provides a composite material, which comprises: a thermosetting mixture in an amount of 20-70 parts by weight, a fiberglass cloth in an amount of 10-60 parts by weight, a powder filler in an amount of 0-55 parts by weight, and a cure initiator in an amount of 1-3 parts by weight.

1. Thermosetting Mixture

A first composition of the composite material of the present invention is a thermosetting mixture with the amount thereof being 20-70 parts by weight and preferably 20-50 parts by weight. The thermosetting mixture comprises: (1) a resin containing vinyl in the amount of more than 60% composed of carbon and hydrogen with its molecular weight being less than 11000; and (2) a solid styryl resin of middle or low molecular weight with unsaturated double bonds.

The component (1), a resin containing vinyl in the amount of more than 60% composed of carbon and hydrogen with its molecular weight being less than 11000, preferably is butadiene styrene copolymer resin or polybutadiene resin with the molecular weight being less than 11000, and the preferably less than 7000. Component (1) is liquid at room temperature, and the viscosity of liquid resin is very low. Therefore it is beneficial to the latter impregnation operation. The resin containing vinyl in the amount of more than 60% composed of carbon and hydrogen with its molecular weight being less than 11000 comprises 30%-75% of the weight of the thermosetting mixture, with the content of 1,2-addition vinyl in the molecular structure of the resin being more than 60%, and preferably more than or equal to 70%. The resin with high vinyl content composed of carbon and hydrogen can provide a great quantity of unsaturated vinyl for curing cross-linked reaction, can increase cross-linking density in curing process, and can provide the circuit substrate with adequate high temperature resistance. The preferable butadiene styrene copolymer resin is such as the Ricon 104H resin (made by Sartomer Company) and Ricon 100 resin (Sartomer) with the content of the 1,2-addition vinyl in its molecular structure being more than or equal to 70%. The preferable polybutadiene resin is such as the B1000, B2000, B3000 resin (Japan Caoda), or such as the Ricon 153 resin (Sartomer) and Ricon 154 resin (Sartomer).

The components (1) are all liquid at room temperature. If the prepregs are only made from them, the tacky problem will occur, which is not beneficial to the following lamination process operation. So the solid component (2) is introduced to improve the tacky property of the prepregs.

The component (2) is a solid styryl resin of middle or low molecular weight with unsaturated double bonds. By adding the solid styryl resin of middle or low molecular weight with unsaturated double bonds, on one hand, the solid styryl resin with unsaturated double bonds cooperates with the resin with high vinyl content composed of carbon and hydrogen to improve the tacky problem of the prepregs caused by only using liquid resin, and on the other hand, the resin composed of carbon and hydrogen comprises benzene ring with better rigidity in its molecular structure. So, comparing with the polybutadiene resin used in the existing patent, the rigid and mechanical strength of the made sheet is better. The solid styryl resin of middle or low molecular weight with unsaturated double bonds comprises 25%-70% of the weight of the thermosetting mixture. When the content is less than 25%, the object of improving the tacky property can not be achieved, and when the content is more than 70%, the dielectric property will become poor and the brittleness of the composite material will be increased.

Comparing with U.S. Pat. No. 5,571,609, the present invention adopts a solid styryl resin of middle or low molecular weight with unsaturated double bonds, of which the number average molecular weight is between 5000 and 50000. Not only the tacky property of the prepregs is improved, but also it will not make the resin flowability bad even if the added amount is very large. The viscosity of the liquid resin will not be too big, and the processing property is good. Besides, not like the U.S. Pat. No. 5,571,609 having to add a large quantity of inorganic filler to improve the tacky property, the present invention adopts a solid styryl resin of middle or low molecular weight, with the number average molecular weight being between 5000 and 50000, and with unsaturated double bonds, which can be added with no or little inorganic filler, so as to decrease wearing out the drill bit during the PCB processing.

As the solid styryl resin of middle or low molecular weight with unsaturated double bonds, it has the following structure formula:

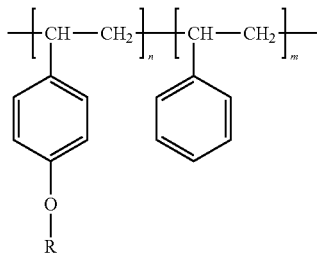

wherein, R is

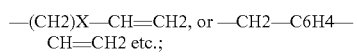

X is 1-3;
n and m are natural numbers, and m/n=0.8~19.

The solid styryl resin of middle or low molecular weight with unsaturated double bonds is obtained by a polyphenolic compound reacting with a reactive monomer with allyl or a reactive monomer with vinyl in inert atmosphere by the action of phase transfer catalyst.

The structure of the polyphenolic compound used to prepare the solid styryl resin of middle or low molecular weight with unsaturated double bonds in the present invention comprises low polar styrene structure. The polyphenolic compound of the present invention is a copolymer of an unsaturated phenol and styrene, and the unsaturated phenol is p-hydroxystyrene. The copolymer of p-hydroxystyrene and styrene can be synthesized via existing methods, such as the method described in JP61-275307, DongJin Woo, Polymer 47 (2006): 3287-3291, or JungKi Kim, Polymer47 (2006): 5799-5809. The copolymer of p-hydroxystyrene and styrene used in the present invention has the following structure formula, wherein, m/n=0.8-19.

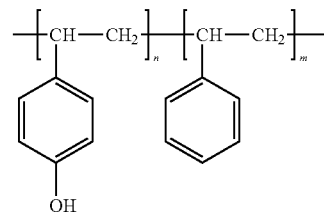

In the present invention, it is phase transfer catalyst that is used as the catalyst to manufacture the solid styryl resin of middle or low molecular weight with unsaturated double bonds, such as onium salt phase transfer catalysts, and crown ether phase transfer catalysts. The phase transfer catalyst can be selected from benzyl triethyl ammonium chloride, tetrabutyl ammonium chloride, tetrabutyl ammonium bromide, tetrabutylammonium hydrogen sulfate, etc.

The reactive monomer with allyl or the reactive monomer with vinyl for manufacturing the solid styryl resin of middle or low molecular weight with unsaturated double bonds can be selected from allyl chloride, methylallyl chloride, allyl bromide, vinyl benzyl chloride, etc., but it is not limited to them.

In the solid styryl resin of middle or low molecular weight with unsaturated double bonds, for the hydroxy (OH) functional group with high polarity is substituted by allyl ether type functional group or vinyl ether type functional group with low polarity, the monolithic polarity of the molecular structure is reduced and the high-frequency property is very good. By using the above mentioned resin with unsaturated double bonds, the made high-frequency circuit substrate material also has good dielectric property.

2. Powder Filler

A certain amount of powder can be added to the composite material of the present invention, and the amount of the powder filler is 0-55 parts by weight. The powder filler can be selected from crystalline silica, amorphous silica, spherical silica, titanium dioxide, strontium titanate, barium titanate, boron nitride, aluminium nitride, silicon carbide, alumina, fiberglass, polytetrafluoroethylene, polyphenylene sulfide, poly(ether sulfones), etc., and the used filler can be one of the above mentioned filters or can be a mixture of the above mentioned filters. Preferably, the powder filler is silica. The particle size medium value of the filler is 1-15 μm, and preferably 1-10 μm. The filler with the particle size medium value of 1-15 μm has good dispersion in liquid resin. For example, the silica filler can be CE44I (CE minerals company), FB-35 (Denka company), or 525 (Sibelco company).

3. Fiberglass Cloth

In the composite material of the present invention, a fiberglass cloth is employed to improve the size stability of the substrate, and to reduce the contraction of laminate resin in curing process. The amount of the fiberglass cloth is 10-60 parts by weight, and preferably 30-57 parts by weight. According to different requirements to the substrate, different fiberglass clothes can be used. Specifications of different fiberglass clothes are listed in the following table.

TABLE 1

| cloth type | cloth thickness | manufacturer |
|---|---|---|
| 7628 | 0.18 | Shanghai honghe |
| 2116 | 0.094 | Shanghai honghe |
| 1080 | 0.056 | Shanghai honghe |
| 106 | 0.04 | Shanghai honghe |

4. Flame Retardant

In the present invention, a flame retardant can be added to improve the fire-retardant property of the sheet. The amount of the flame retardant of the present invention is 0-35 parts by weight. Bromine containing flame retardant or phosphorus containing flame retardant can be adopted. The preferable flame retardant will not reduce the dielectric property. For example, the preferable bromine containing flame retardant is decabromodiphenyl ether, decabromodiphenylethane or ethylenebis(tetrabromophthalimide). The preferable phosphorus containing flame retardant is tris(2,6-dimethylphenyl) phosphin, 10-(2,5-dihydroxyphenyl)-9, 10-dihydro-9-oxa-10-phosphaphenanthrene-10-Oxide, 2,6-(2,6-dimethylphenyl)phosphino phenyl, or 10-phenyl-9,10-dihydro-9-oxa-10-phosphaphenanthrene-10-Oxide.

5. Cure Initiator

In the composite material of the present invention, the cure initiator is employed to accelerate reaction. When the composite material of the present invention is heated, the cure initiator is decomposed to generate free radicals which enable the molecular chain of the polymer to cross-link. The usage amount of the cure initiator is 1-3 parts by weight, and is between 1% and 10% of the usage amount of the thermosetting mixture. The cure initiator is selected from the materials capable of producing free radicals. For example, the preferable cure initiator is dicumyl peroxide, Tert-Butyl peroxybenzoate, or 2,5-bis(2-ehylhexanoylperoxy)-2,5-dimethylhexane, etc.

6. Auxiliary Crosslinking Agent

In the composite material of the present invention, a certain amount of auxiliary crosslinking agent can be added to improve the cross-linking density. For example, the auxiliary crosslinking agent can be selected from triallyl isocyanurate, triallyl cyanurate, divinylbenzene, and multifunction ACRYLATE, etc.

The present invention also provides a method of using the above mentioned composite material to make a high-frequency circuit substrate, which includes the following steps:

Step 1, weighing the components of the composite material, which comprises: (1) 20-70 parts by weight of thermosetting mixture including a resin containing vinyl in the amount of more than 60% composed of carbon and hydrogen with its molecular weight less than 11000, and a solid styryl resin of middle or low molecular weight, with the number average molecular weight being between 5000 and 50000, and with unsaturated double bonds; (2) 10-60 parts by weight of fiberglass cloth; (3) 0-55 parts by weight of powder filler; (4) 1-3 parts by weight of cure initiator;

Step 2, mixing the weighed thermosetting mixture, powder filler, flame retardant and cure initiator, diluting the resin system to an appropriate viscosity with a solvent, evenly stirring and mixing to make the filler evenly disperse in the resin system thereby obtaining a glue solution, impregnating the fiberglass cloth in the glue solution and controlling the fiberglass cloth to be at an appropriate thickness, and then removing the solvent to form prepregs;

Step 3, overlapping a plurality of said prepregs, respectively covering a copper foil on both top and bottom surfaces of the overlapped prepregs, putting the prepregs and copper foil assembly into a press machine to cure with a curing temperature of 150-300° C. and a curing pressure of 25-70 Kg/cm², and thereby forming said high-frequency circuit substrate.

The high-frequency circuit substrate manufactured by the above mentioned method of the present invention comprises a plurality of prepregs mutually overlapped, and copper foils respectively covered on both sides of the overlapped prepregs. Each prepreg is made from the above mentioned composite material.

The dielectric properties of the above mentioned high-frequency circuit substrate, that is, dielectric constant, dielectric loss tangent, high-frequency property, and heat resistance, will be best understood from the following detailed description with reference to the accompanying embodiments.

The components of the composite material selected in the embodiments of the present invention are shown in the following Table 2.

TABLE 2

| manufacturer | product name or trademark | material content |
|---|---|---|
| Sartomer | Ricon 100 | polybutadiene styrene copolymer resin, Mn = 4500, 1,2-vinyl = 70% |
| Sibelco | 525 | amorphous silica |
| Albemarle | SAYTEX8010 | decabromodiphenylethane |
| Shanghai gaoqiao | DCP | dicumyl peroxide |
| Shanghai honghe | 1080 fiberglass cloth | depth = 0.05 mm, basic weight = 48 g/m² |

Embodiment 1

Step 1:

Adding the copolymer of p-hydroxystyrene and styrene, allyl chloride, benzyl triethyl ammonium chloride, and toluene together into a four-neck flask, wherein the molar ratio of the copolymer of p-hydroxystyrene and styrene to allyl chloride is 1:12, and the usage amount of benzyl triethyl ammonium chloride is 1% of the copolymer of p-hydroxystyrene and styrene (molar ratio); the copolymer of p-hydroxystyrene and styrene is synthesized via existing methods (such as the method described in JP61-275307, DongJin Woo, Polymer47 (2006): 3287-3291, or JungKi Kim, Polymer47 (2006): 5799-5809), and Mn is 8500. Heating the above mentioned mixture in nitrogen atmosphere, the heating-up temperature being 100° C., and the reaction time being 2 hours. Filtering after the reaction, washing to remove salts, removing the excessive allyl chloride by reduced pressure distillation, and finally obtaining the solid styryl resin with unsaturated double bonds. The Mn of the solid styryl resin with unsaturated double bonds is 9380.

Step 2:

Mixing 55.6 parts by weight of liquid butadiene styrene copolymer resin Ricon100, 44.4 parts by weight of the solid styryl resin of middle or low molecular weight with unsaturated double bonds synthesized in Step 1, 85 parts by weight of silica (525), 32 parts by weight of fire retardant SAYTEX8010, and 6.5 parts by weight of cure initiator DCP together, diluting to an appropriate viscosity with solvent xylene, and then evenly stirring and mixing to make the filler evenly disperse in the resin system, thereby obtaining a glue solution. Impregnating fiberglass cloth 1080 with the glue solution, then drying the fiberglass cloth to remove the solvent thereby obtaining prepregs. Since the prepreg is non-tacky, the process operation is simple. Overlapping eight made prepregs, and covering two copper foils of 1 oz thickness on both top and bottom surfaces of the overlapped prepregs, and then puting the assembly of two copper foils and eight prepregs into a press machine to cure for 2 hour with a curing pressure of 50 Kg/cm$^2$ and curing temperature of 190° C. The physical data are shown in Table 3.

Embodiments 2, 3, and 4

The process of embodiments 2, 3 and 4 is similar to that of Embodiment 1, but the proportion of the composite material in Step 2 is changed as shown in Table 3.

COMPARISON EXAMPLE 1

The process of comparison example 1 is similar to Embodiment 1, but the solid styryl resin of middle or low molecular weight with unsaturated double bonds is removed, and the material proportion is shown in Table 3. The molding temperature is kept at 300° C. for 30 minutes.

COMPARISON EXAMPLE 2

Step 1:

Adding 90.00 g (0.21 mol) of novolac and 135 g of normal butanol into a 500 ml three-neck flask provided with mechanical stirring, drain sleeve, and thermometer, adding 29.87 g (0.44 mol) of potassium hydroxide after the novolac is completely dissolved, reacting for 2 hours, then adding 42.41 g (0.44 mol) of allyl chloride in drops, and then reacting for 6 hours. After the reaction, filtering the mixture while it is hot, washing to be white color with butanol after filtering, removing the solvent thereof by reduced pressure distillation (100° C., 0.08 MPa), washing with ten times of deionized water until the PH value to be 7, and then removing the water by reduced pressure distillation (100° C., 0.08 MPa), thereby obtaining allyl novolac.

Step 2:

Mixing 55.6 parts by weight of liquid butadiene styrene copolymer resin Ricon100, 44.4 parts by weight of the allyl novolac synthesized in Step 1 of the comparison example 2, 85 parts by weight of silica (525), 32 parts by weight of flame retardant SAYTEX8010, and 6.5 parts by weight of cure initiator DCP together, diluting to an appropriate viscosity with solvent xylene, and then evenly stirring and mixing to make the filler evenly disperse in the resin system, thereby obtaining a glue solution. Impregnating fiberglass cloth 1080 with the glue solution, then drying the fiberglass cloth to remove the solvent thereby obtaining prepregs. Since the prepreg is non-tacky, the process operation is simple. Overlapping eight made prepregs, and covering two copper foils of 1 oz (ounce) thickness on both top and bottom surfaces of the overlapped prepregs, and then putting the assembly of two copper foils and eight prepregs into a press machine to cure for 2 hour with a curing pressure of 50 Kg/cm$^2$ and curing temperature of 190° C. The physical data are shown in Table 3.

TABLE 3

| material and performance | Embodiment 1 | Embodiment 2 | Embodiment 3 | Embodiment 4 | Comparison example 1 | Comparison example 2 |
|---|---|---|---|---|---|---|
| Ricon 100 | 55.6 | 62 | 38 | 55.6 | 100 | 55 · 6 |
| solid styryl resin with unsaturated double bonds | 44.4 | 38 | 52 | 44.4 | 0 | 0 |
| allyl novolac | 0 | 0 | 0 | 0 | 0 | 44.4 |
| 525 | 85 | 240 | 45 | 0 | 85 | 85 |
| DCP | 6.5 | 7.5 | 5.6 | 6.5 | 5.8 | 6.5 |
| SAYTEX8010 | 32 | 35 | 0 | 40 | 28 | 32 |
| 1080 fiberglass cloth | 80.7 | 125 | 78 | 80.7 | 92 | 80.7 |
| peel strength (N/mm) | 0.91 | 0.89 | 0.95 | 0.90 | 0.52 | 0.94 |
| dielectric constant (10 GHZ) | 3.25 | 3.48 | 3.18 | 2.89 | 3.15 | 3.48 |
| dielectric loss tangent (10 GHZ) | 0.0043 | 0.004 | 0.0047 | 0.0046 | 0.0026 | 0.0063 |
| solder limits 288° C. (second) | >120 | >120 | >120 | >120 | >120 | >120 |
| tacky property of the prepregs | not tacky | not tacky | not tacky | not tacky | tacky | not tacky |
| bending strength (MPa) | 360 | 300 | 410 | 430 | 260 | 380 |
| T288 (min.) | >15 | >15 | >15 | >15 | 2 | >15 |

Physical Analysis

From the physical data of Table 3, the circuit substrate materials made in embodiments 1, 2, 3 and 4 have low dielectric constant, low dielectric loss tangent, and excellent high-frequency properties. Comparing with the comparison example 1, the solid styryl resin of middle or low molecular weight with unsaturated double bonds is introduced to the embodiments 1, 2, 3 and 4, which effectively improve the tacky property of prepregs and bending strength. The prepregs of the embodiments 1, 2, 3 and 4 have very good heat resistance, small dielectric constant and small dielectric loss tangent. For example, the pregregs can endure a constant temperature of 288° C. for 15 minutes without stratification, are both very small. Besides, for the solid styryl resin of middle or low molecular weight with unsaturated double bonds is introduced, the molding temperature can be at 190° C., which is much less than the molding temperature at 300° C. of the comparison examples.

As mentioned above, comparing with the general copper foil substrate, the circuit substrate of the present invention has more excellent dielectric properties, namely, comparatively low dielectric constant, low dielectric loss tangent, and excellent high-frequency properties.

Although the present invention has been described in detail with above said preferred embodiments, but it is not to limit the scope of the invention. So, all the modifications and changes according to the characteristic and spirit of the present invention, are involved in the protected scope of the invention.

What is claimed is:

1. A composite material comprising:
    a thermosetting mixture in an amount of 20-70 parts by weight, the thermosetting mixture including a liquid resin containing vinyl in an amount of more than 60% composed of carbon and hydrogen with its molecular weight being less than 11,000 g/mol, the liquid resin comprising 30%-75% of the weight of the thermosetting mixture, and a solid styryl resin of middle or low molecular weight with unsaturated double bonds having a molecular weight of 5,000-50,000 g/mol;
    wherein the solid styryl resin with unsaturated double bonds has the following structure formula:

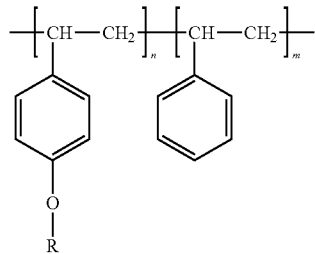

wherein, R is:
    —(CH2)X—CH=CH2, or —CH2—C6H4—CH=CH2;
    X is 1-3;
    n and m are natural numbers, and m/n=0.8~9;
wherein the solid styryl resin with unsaturated double bonds comprises 25%-70% of the weight of the thermosetting mixture;
a fiberglass cloth in an amount of 10-60 parts by weight;
a powder filler in an amount of 0-55 parts by weight; and
a cure initiator in an amount of 1-3 parts by weight, based on 100 parts by weight of the composite material.

2. The composite material of claim 1, wherein the liquid resin containing vinyl in an amount of more than 60% composed of carbon and hydrogen with its molecular weight being less than 11,000 g/mol uses the solid styryl resin of middle or low molecular weight with unsaturated double bonds as a curing agent.

3. The composite material of claim 1, wherein the powder filler is one or more selected from crystalline silica, amorphous silica, spherical silica, titanium dioxide, strontium titanate, barium titanate, boron nitride, aluminium nitride, silicon carbide, alumina, fiberglass, polytetrafluoroethylene, Polyphenylene Sulfide, and poly(ether sulfones).

4. The composite material of claim 1, further comprising a bromine or phosphorus containing flame retardant.

5. The composite material of claim 4, wherein the bromine containing flame retardant is decabromodiphenyl ether, decabromodiphenylethane, or ethylenebis(tetrabromophthalimide); the phosphorus containing flame retardant is tris(2,6-dimethylphenyl) phosphin, 10-(2,5-dihydroxyphenyl)-9,10-dihydro-9-oxa-10-phosphaphenanthrene-10-Oxide, 2,6-(2,6-dimethylphenyl) phosphino phenyl, or 10-phenyl-9,10-dihydro-9-oxa-10-phosphaphenanthrene-10-Oxide.

6. The composite material of claim 1, wherein the cure initiator is selected from materials capable of producing free radicals including dicumyl peroxide, Tert-Butyl peroxybenzoate, or 2,5-bis(2-ehylhexanoylperoxy)-2,5-dimethylhexane.

7. The composite material of claim 1, further comprising an auxiliary crosslinking agent, and the auxiliary crosslinking agent is selected from triallyl isocyanurate, triallyl cyanurate, divinylbenzene, or multifunction ACRYLATE.

* * * * *